United States Patent [19]
Belcea

[11] Patent Number: 6,092,070
[45] Date of Patent: *Jul. 18, 2000

[54] METHOD AND SYSTEM FOR LOSSLESS DATE COMPRESSION AND FAST RECURSIVE EXPANSION

[75] Inventor: John Martin Belcea, Morristown, N.J.

[73] Assignee: Telcordia Technologies, Inc., Morristown, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/634,084

[22] Filed: Apr. 18, 1996

Related U.S. Application Data

[63] Continuation of application No. 08/336,720, Nov. 9, 1994, abandoned, which is a continuation of application No. 07/833,974, Feb. 11, 1992, abandoned.

[51] Int. Cl.[7] ................................................. G06F 17/30
[52] U.S. Cl. .............................................. 707/101; 341/50
[58] Field of Search ........................ 364/DIG. 1, DIG. 2; 341/50–52, 55, 89, 106; 395/600; 707/103, 101

[56] References Cited

U.S. PATENT DOCUMENTS

| | | | |
|---|---|---|---|
| 4,796,003 | 1/1989 | Bentley et al. | 341/95 |
| 4,868,570 | 9/1989 | Davis | 341/106 |
| 4,970,682 | 11/1990 | Beckwith, Jr. et al. | 364/900 |
| 4,988,998 | 1/1991 | O'Brien | 341/55 |
| 5,001,478 | 3/1991 | Nagy | 341/67 |
| 5,010,345 | 4/1991 | Nagy | 341/65 |
| 5,016,009 | 5/1991 | Whiting et al. | 341/67 |
| 5,023,610 | 6/1991 | Rubow et al. | 341/51 |
| 5,049,881 | 9/1991 | Gibson et al. | 341/95 |
| 5,051,745 | 9/1991 | Katz | 341/51 |
| 5,124,791 | 6/1992 | Israelsen et al. | 358/136 |
| 5,150,430 | 9/1992 | Chu | 382/56 |
| 5,155,484 | 10/1992 | Chambers, IV | 341/55 |
| 5,184,126 | 2/1993 | Nagy | 341/67 |
| 5,281,967 | 1/1994 | Jung | 341/55 |

*Primary Examiner*—Maria N. Von Buhr
*Attorney, Agent, or Firm*—Joseph Giordano; David A. Hey; Elizabeth A. Mark

[57] ABSTRACT

A highly effective method for operating data processing equipment to achieve data compression with high coding and storage efficiency and a method and apparatus for fast data retrieval while preserving full information content of the source data. This compressing method was used to successfully reduce the U.S. Geological Survey Database from 9.4 gigabytes to 800 megabytes, a reduction of over 90%. The compression method is an iterative and recursive process. At each iteration a data element is read into a buffer and then the pair formed by the last two elements in the buffer is checked against the rest of buffer. If a match is found in the buffer, the second element of the data element pair is removed and the first element is replaced by an index that indicates the sequential location in the buffer when the matching pair is found. The search for a matching pair is then repeated using the last two elements now in the buffer. When a matching pair is not found a new data element is added to the buffer and the whole process is repeated. After the last data element is entered in the buffer, the buffer is copied to an output file where the data elements are stored as is, and the location index is stored using fewer bits.

9 Claims, 5 Drawing Sheets

METHOD AND SYSTEM FOR LOSSLESS DATE COMPRESSION AND FAST RECURSIVE EXPANSION

This application is a continuation of application Ser. No. 08/336,720, filed on Nov. 9, 1994, now abandoned, which is itself a continuation of application Ser. No. 07/833,974, filed on Feb. 11, 1992, now abandoned.

TECHNICAL FIELD

This invention relates to data processing and more specifically to systems and methods involving the compression of very large databases to allow such data bases to be stored in significantly smaller stores and the fast expansion and retrieval of the compressed information for use in a data processing system as if the total large database had been stored.

BACKGROUND OF THE INVENTION

The large improvement in processing power in personal computers and work stations has created the incentive to port to these newer machines many main-frame applications. However, many large applications are on main frames not only because of the processing power needed but because of their ability to access and control large storage devices making them useful for applications that require access to large databases. One such application is the nationwide radio frequency coordination and engineering system owned, operated and maintained by Bell Communications Research Inc. (Bellcore) and which uses the U.S. Geological Survey three second database. This database is needed by this system to produce signal maps and to conduct spectral analysis for the placement of radio receivers and transmitters in a given area; the database is over 9.4 gigabytes. The telephone company users of this system have been required to access the system remotely which is expensive and sometimes presents the users with problems because of vagaries in the performance of the transmission facilities over long distances. As a result, a work station based version of the system is desirable. However, for a work station version of the system to be practical it is necessary to compress the U.S. Survey Geological Database into a size such that it can be stored within a work station in a manner that is conducive to fast and accurate expansion of segments of the data when needed.

The U.S. Geological Survey three second terrain database is a vital component for radio engineering applications used to generate terrain profiles for signal level evaluations necessary for radio transmitter and receiver placements. To port such an application to a work station or personal computer platform places restrictions on the allowable size and structure of the database. These restrictions are as follows: small file sizes, internal memory limits to 640K bytes, relative small computing speed, interactive operation, and assurance of data portability using low density magnetic storage medium i.e. floppy disks.

A terrain profile is an ordered collection of elevation values along a radial. The radial is the shortest path between two points on the surface of the earth; thus it follows the geodesic line passing through both points. This fact imposes the conclusion that, excepting for an extremely small number of cases, no elevation data will be accessed as an individual value, but as a set of data placed along the same geodesic line. The best type of organization for that kind of data would be the square matrix. As a result, the database was organized in records composed of a three minute by three minute square matrix containing 3721 (61×61) three second elevation values. The elevations on the boarders of each square matrix are repeated on the neighboring matrix. In this mode any interpolation required for computing the elevation in any point not matching the 3 second by 3 second raster can be done by accessing only one data record. A group of 25 records are enclosed in the same file. A 1 degree by 1 degree square is made from 16 different files. Each file is given the name of the southeast corner coordinates. Each file has a header with 25 entries defining the position in the file where each record is stored.

The record structure of each 3 minute record is comprised of a 2 byte integer representing the smallest elevation value found in that record, a one byte length flag with the value or 1 or 2, and 3721 integer values stored as one or two byte integers, the values of which are relative to the smallest elevation value contained in the record. If the maximum value of the relative elevation is greater than 255, the flag is set to 2 and the values of the relative elevation are represented as a two byte integer; if the maximum value of the relative elevation is smaller then 256, the flag is set to 1 and the values or the relative elevation are represented as a one byte integer. The problem presented by this large database was to be able to compress this data into a form that can be both segmented according to a users specific geographic needs (i.e. users in one state only need the geological data for that state) and can be loaded into a personal computer limited in size as described above.

In general, data compression algorithms are based on the simple idea of mapping the representation of data from one group of symbols to another more concise series of symbols. Two schemes form the basis of many of the data compression algorithms currently known in the art. These are Huffman coding and LZW (for Lempel and Ziv, its creators, and Welch, who made substantial contributions) coding. Both Huffman and LZW coding are lossless compression techniques, meaning they do not lose any information as a result of the compression and expansion process. Huffman coding, originally proposed sometime in the 1950s, reduces the number of bits used to represent characters that occur frequently in the data and increases the number of bits for characters that occur infrequently. The LZW method, on the other hand, encodes strings of characters, using the input data to build an expanded alphabet based on the strings that it sees. These two different approaches both work by reducing redundant information in the input data. Compression by Huffman coding requires that the compressor know or learn the probabilities of each type of data to compress. In order to learn the probabilities, Huffman coding performs two passes over the data requiring temporary storage of the entire data block, which is memory intensive especially for large databases. LZW, on the other hand, works by extending the alphabet using the additional characters to represent strings of regular characters. The key to the algorithm is the establishment of a table that matches character strings with code words representing strings. This table must exist as an index for translating between the stored or transmitted code and the original symbol. The use of such a table is also memory intensive.

Another approach for data compression is disclosed in U.S. Pat. No. 4,796,003 by Bentley et al. entitled "Data Compaction". Bentley et al. discloses an algorithm based on the redundancy of words (i.e. partitioned segments of data). It employs a word list with the position of each word on the list encoded in a variable length code. The shortest code represents the word at the beginning of the list. This list is dynamically created during the compression process. Each word from the data stream to be compressed is compared to the words in the list; if the word is found the variable length code representing the word position is stored instead of the word itself and the word is moved to the head of the list. If the word is not on the list, the word itself is stored and then that word is placed at the head of the word list. This compaction method requires the development and maintenance of a word list separate from the actual data. For expansion, the word list has to be regenerated, which is not conducive for fast expansion of the compressed data.

One object of the present invention is to be able to compress large databases into a size that can be used in work stations. A second object of the present invention is to compress large scale databases without having to generate separate translation tables or word lists. A third object of the invention is to achieve a high rate of compression while still being able to expand segments of the database without needing to have complete knowledge of the database. A fourth object of the invention is to compress the database in a manner that enhances rapid data expansion.

SUMMARY OF THE INVENTION

My invention affords a highly effective method for data compression to achieve high coding and storage efficiency and as systems and method for fast data retrieval while preserving full information content of the source data. My method has successfully reduced the U.S. Geological Survey Database from 9.4 gigabytes to 800 megabytes, a reduction of over 90%. The compression method of my invention is an iterative process. At each iteration a data element is read into a buffer and then the pair formed by the last two elements in the buffer is checked against the rest of buffer. If a match is found in the buffer, the second element of the data element pair is removed and the first element is replaced by an index that indicates the location in sequence in the buffer where the matching pair is found. The search for a matching pair is then repeated using the last two elements now in the buffer. When a matching pair is not found, a new data element is added to the buffer and the whole process is repeated. After the last data element is entered in the buffer, the buffer is copied to an output file. Data elements are stored using only the number of bits necessary to represent the data elements and the location index is stored using the fewest bits necessary to represent the location index number.

DETAILED DESCRIPTION OF THE DRAWINGS

DETAILED DESCRIPTION

Figure 1:
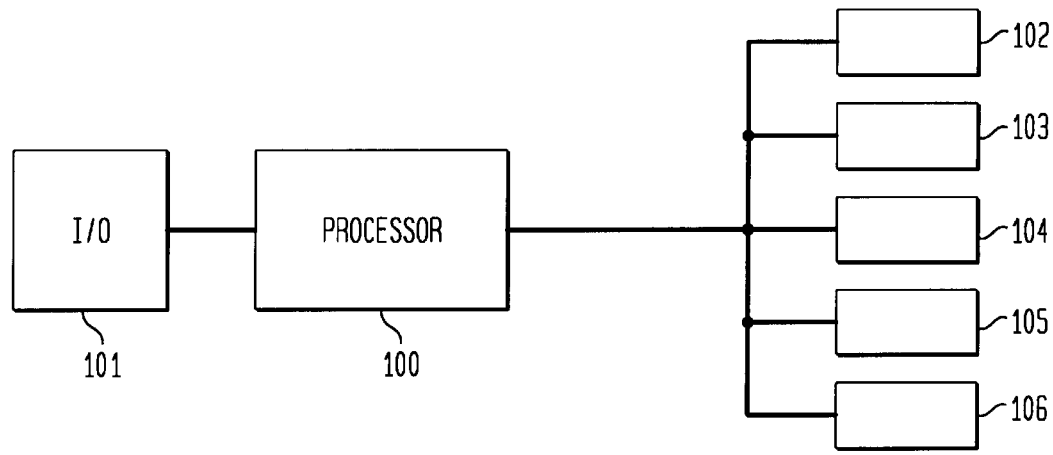
FIG. 1 is a generalized block diagram of a large main frame data processing system of the prior art as has been required for the storage of very large databases.

As discussed above, in the prior art large main frame computers have been required where very large databases have been involved because of the need to store and work on very large amounts of data, such as the U.S. Survey Geological Database. FIG. 1 depicts, in very simplified manner, such a prior art computer comprising a central processor and controller 100 which interacts with any of the known varieties of input/output equipments 101. Connected to the processor 100 is the storage for the large database and which may, as shown, comprise a plurality of data stores 102–106 which together provide the requisite gigabyte storage as is required for U.S. Survey Geological Database.

Figure 2:
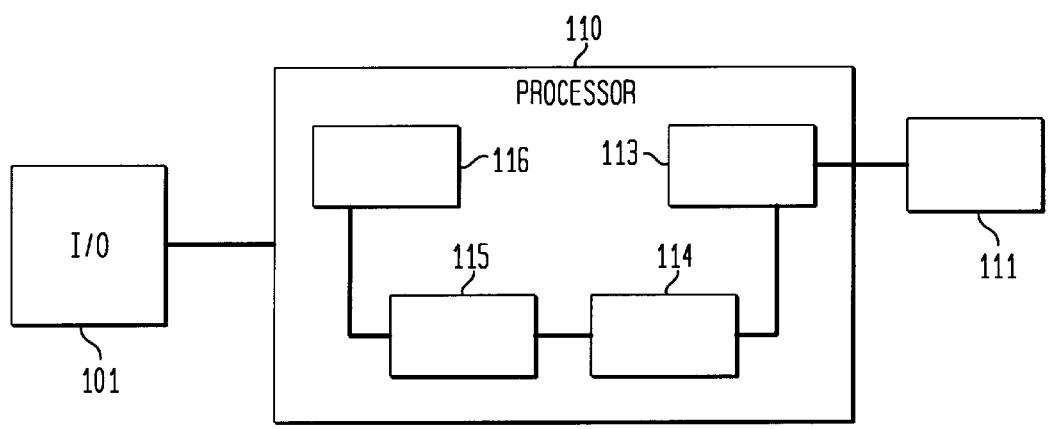
FIG. 2 is a generalized block diagram of a workstation data processing system in accordance with my invention wherein the large data bases have been compressed and stored in accordance with the data compression method of my invention.

In accordance with my invention with the data stored in a database in a compressed format, a small workstation processor such as shown in FIG. 2 can be employed in place of the large main frame computer of FIG. 1. The work station processor in accordance with my invention will include the same input/output equipment interacting with the processor 110. However, in place of the multiple or very large storage devices 102–106 of the prior art, a single store 111 is employed, the information being stored in the store in a compressed form in accordance with my invention, as discussed further below.

When information is to be read from the store 111, in accordance with an aspect of my invention, the compressed information is read into a buffer 113 in the processor 110. The information in the buffer 113 is then examined by circuit 114 to identify different types of data elements, which causes a writing circuit 115 to write into a file store 116 the expanded information from the compressed form stored in the database store 111. The circuitry just described within the processor 110 thus expands the compressed database information to its normal or expanded format for use in the processor 110 in the same manner as in the prior art. The operation and functioning of these circuit elements will be clearer after consideration of the below description of my inventive method for compressing the database to be stored in the database store 111.

Figure 3:
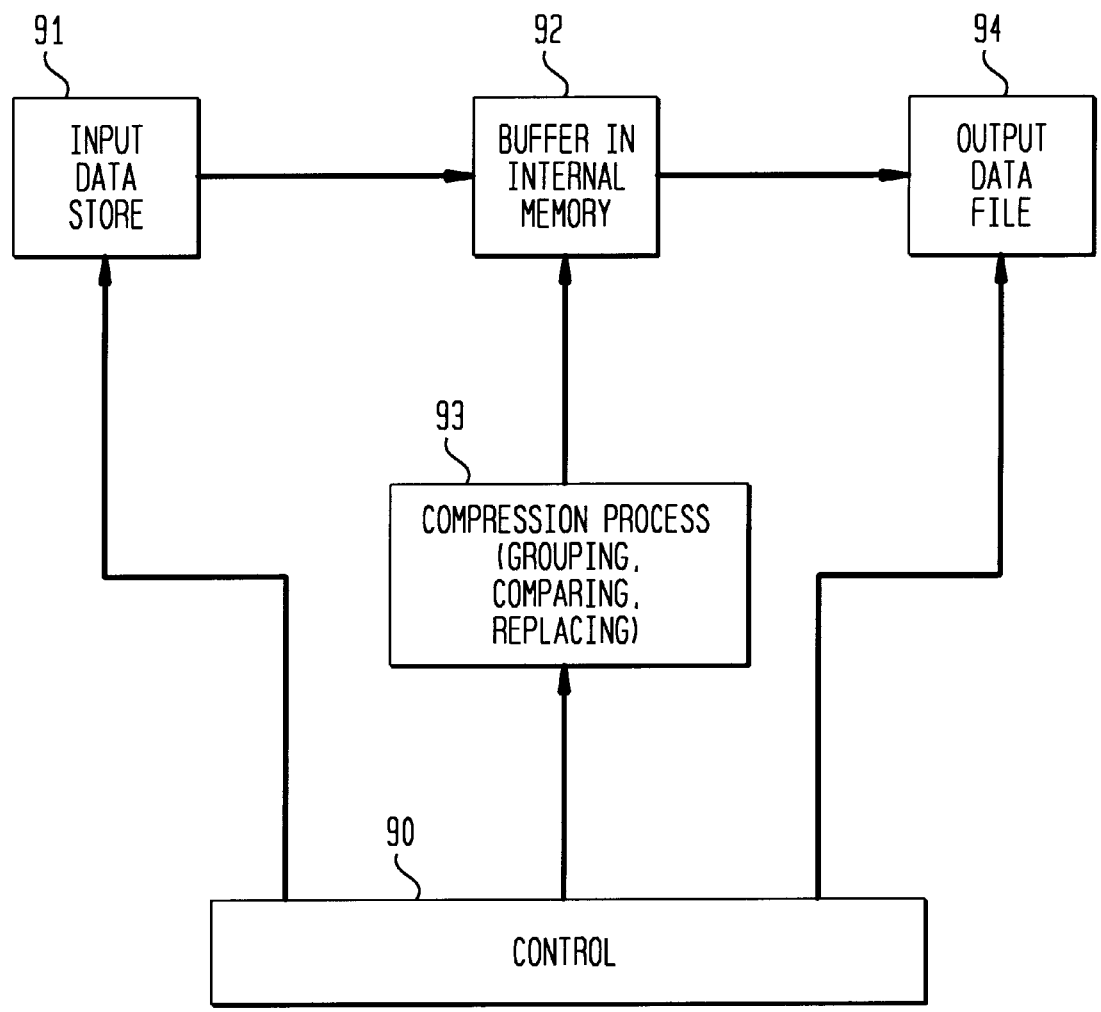
FIG. 3 is a generalized schematic representation of the data processing elements used in the practice of the database compression method of my invention.

A generalized schematic representation of the data processing equipment used in the practice of the compression method of my invention is shown in FIG. 3. A central control processor 90 causes a data record to be read from the data store 91 to a buffer in internal memory 92. The central control process 90 then initiates my inventive compression method in compression process 93. This compression process 93 operates on the data record in the buffer in internal memory 92 by grouping, comparing, and replacing duplicate data elements in the data record with an index value of the position in the buffer where the first match occurs. When the process is complete, the compressed data record in the buffer in internal memory is written to an output file 94 with each data element stored using only the number of bytes necessary and each index value is stored using even fewer bits.

In a preferred embodiment, my invention compresses each record independently. The compression procedure has five general steps. First, record data is loaded into a buffer an element at a time. Second, starting with the third element, the pair formed by the last two elements in the buffer is checked against the whole buffer (less the last two just entered). Thirdly, if the combination of the last two is found in the buffer, the second element from the last two entered is removed, but the first one is replaced by a value representing the position in the buffer where the matching pair is found. This index value is written into the buffer as a negative number and herein called a metacharacter, whereas actual data elements are herein called characters. Metacharacters are negative to distinguish them from characters. The fourth step in the search for the matching pair is then restarted using the last two data elements (characters or metacharacters) in the buffer. When a matching pair cannot be found, a new character is added to the buffer and processed according to the steps heretofore described. Finally, when the entire record is entered into the buffer, an output file containing the compressed data is then built. Each element stored in the buffer (both characters and metacharacters) is written to the output file preceded by a flag bit. Characters are stored using only the number of bytes necessary to represent the character. Each metacharacter is first replaced by a value equal to the sum of the metacharacter and its position in the buffer and then stored using only the number of bits necessary to represent the index value. The flag bit is set at zero for characters and 1 for metacharacters.

Figure 4:
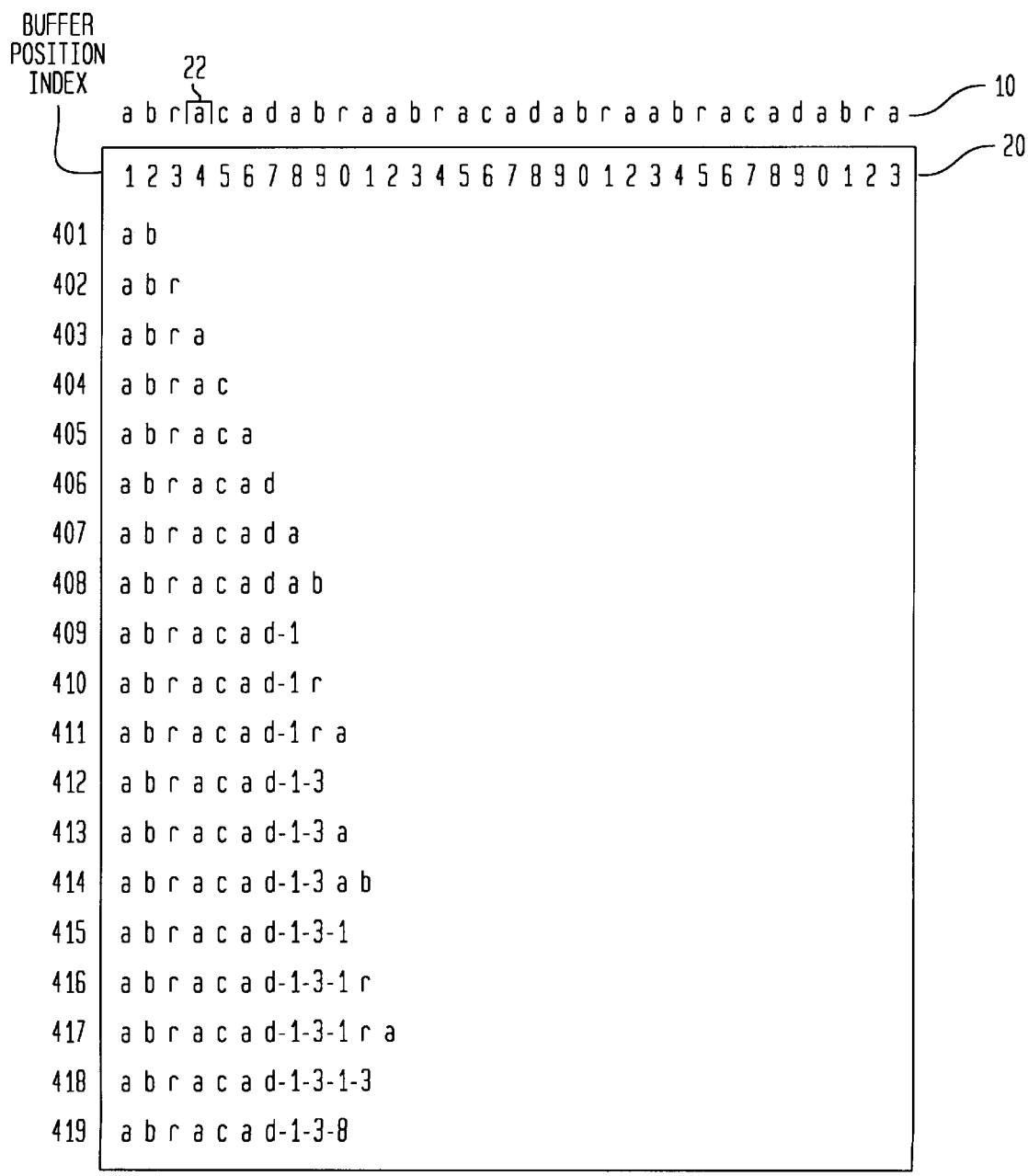
FIG. 4 depicts the iterative changes to an example expression compressed in accordance with the present invention.

The best way to understand the method is to use it in an example. For illustrative purposes the expression "abracadabraabracadabraabracadabra" is compressed using the best mode of implementing my inventive method. FIG. 4 depicts this example database record 10 and a buffer 20 with each line depicting how the buffer changes at each iteration as the compression method is applied to the data. To compress this expression 10 the buffer 20 is initialized at buffer positions 1 and 2 with the first two elements "ab" shown in line 401. The third element "r" is then added to the buffer 20 at position 3 shown at line 402. The pair formed by the last two elements "b,r" in the buffer is compared to each of the other pairs in the buffer. When a match is not found the next element "a" 22 from the expression 10 is read into the buffer 20 at position 4 depicted in line 403. Again, the last two elements "r,a" are paired and compared against the buffer as a whole. Lines 404–408 depict the addition of one element to the buffer for each iteration where a match is not found. In line 408 the last two elements "a,b" in the buffer match the first two elements in the buffer. Upon finding the match, the second element "b" of the "a,b" pair is eliminated, and the first element "a" is replaced with the negative value for the index of buffer position where the match is found, in this instance "−1" as shown in line 409 at position 8. The use of the negative number acts as a flag to identify this element as a metacharacter. A new pairing "d,−1" in line 409 of the last two elements in the buffer is formed and compared against the buffer as a whole. If a match is not found then the next element from the expression to be compressed is added to the buffer. Line 410 shows the addition of the element "r" to the buffer. The pair "−1,r" is now formed and compared to each pair in the buffer. Line 411 shows the addition to the element "a" to the buffer. The pair "r,a" is compared to each pair in the buffer and a match is found at buffer position 3. Line 412 depicts the elimination of the second element in the pair and the replacement of the first element with a "−3" indicating the position in the buffer of the match. Line 413 shows the addition of the next element "a" from the expression 10 added to the buffer at position 10. The pair "−3,a" is compared against each pair in the buffer and since a match is not found the next element "b" is added to the buffer as shown in line 414. However, when the pair "a,b" is compared against the buffer, a match is found at buffer position 1. Therefore in accordance with my invention, the pair "a,b" is replaced with "−1" at position 10 as shown in line 415. Line 416 and 417 shows the addition of the data elements "r" and "a" and line 418 depicts the replacement of the pair "r,a" with the metacharacter "−3". Line 419 shows the first instance where when a matching pair contains a metacharacter it is replaced with another metacharacter. The last two characters in the buffer as shown in line 418 are the metacharacters "−1,−3". When compared against the buffer a match is found at position 8 and therefore, this pair "−1,−3" is replaced with the metacharacter "−8" in position 10 as shown in line 419.

Figure 5:
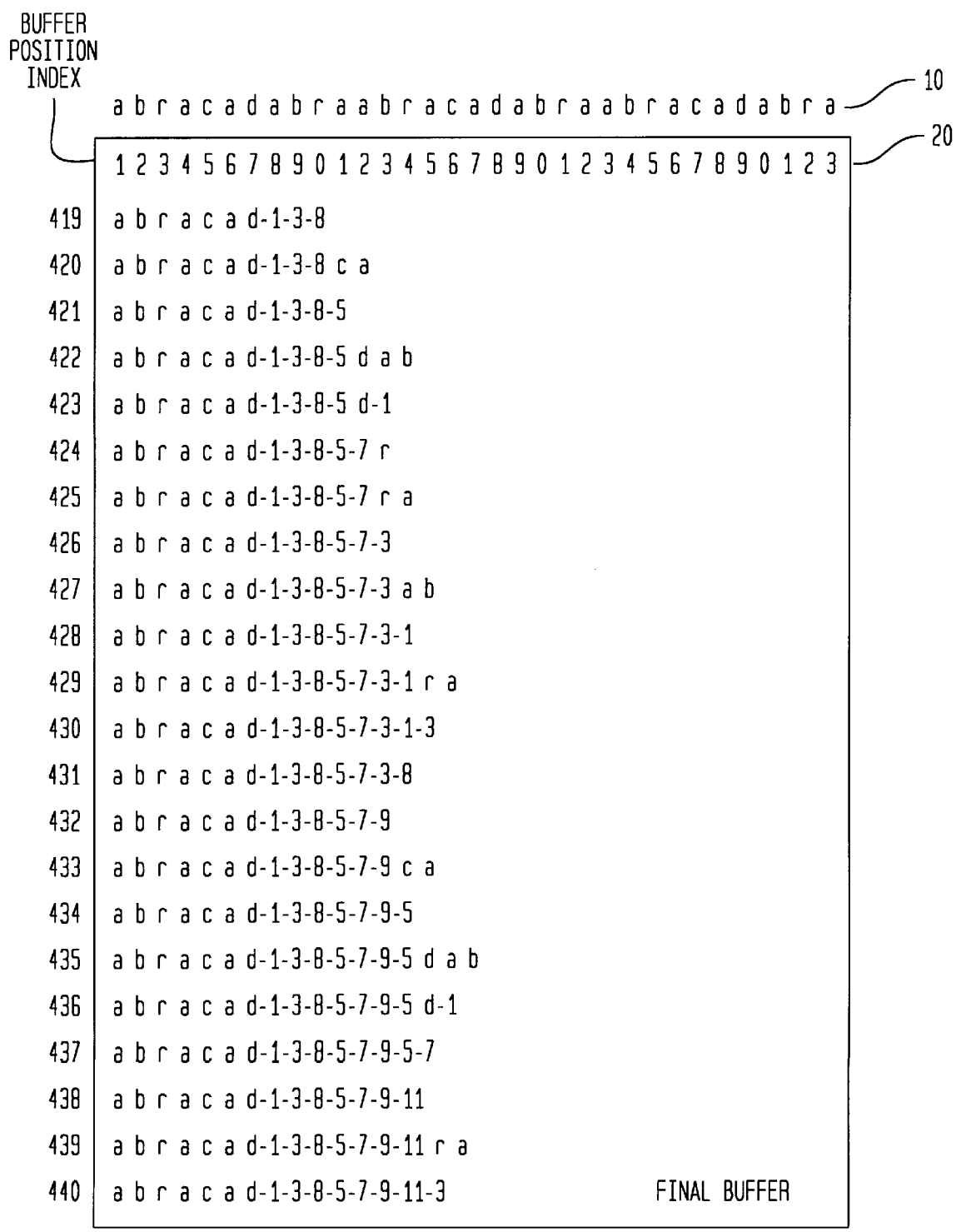
FIG. 5 depicts the completion of compressing the example expression and the final buffer result in accordance with the present invention.

FIG. 5 depicts the rest of iterative changes to the buffer as a result of the application of my data compression method. The final content of the buffer is shown in line 440. The final step of my inventive method is to build an output file for storage in some electronic storage medium. The building of the output file provides additional compression of the data.

Figure 6:
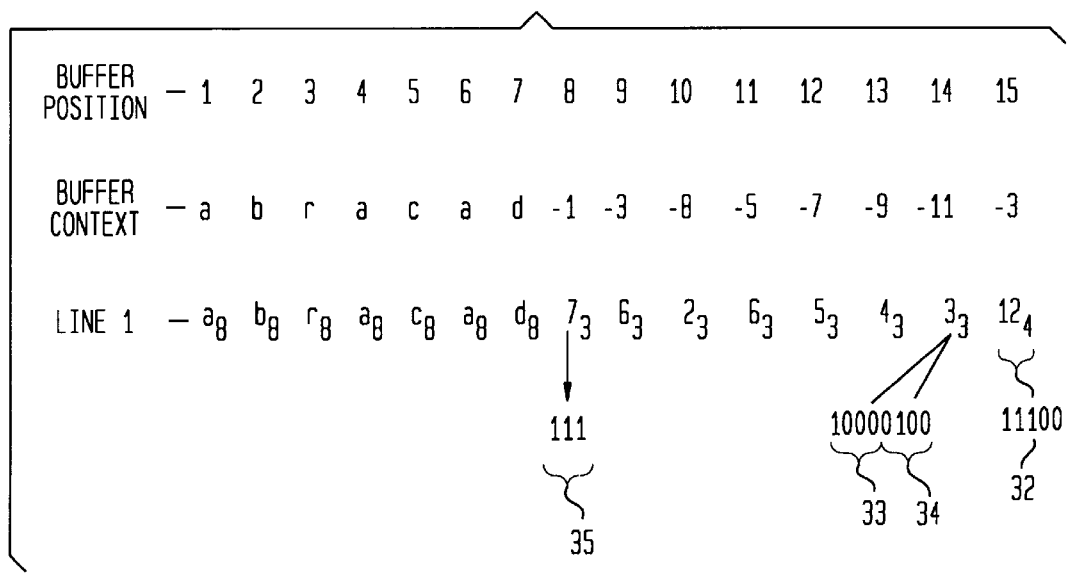
FIG. 6 depicts the building of an output file in accordance with the present invention.

To build the output file each character in the buffer is written using only the number of bits necessary to represent the information with each data element preceded by a flag bit set to 0. Each metacharacter is first replaced by the sum of its value and its position in the buffer and then written using three bits preceded by a flag bit set to 1. Line 1 in FIG. 6 depicts this process (where $a_b$ means the value of "a" represented as a "b" bit binary number). As a specific example, the first metacharacter encountered in the final buffer is at bit position 8 and has the value −1, therefore it is replaced by the value 7. Item 35 shows how this metacharacter is encoded. This value is stored in the output file using 3 bits. A problem arises if the value of the replacement metacharacter is greater than seven. It is an additional aspect of my invention to change the length of the metacharacter to the size needed. Specifically, looking at bit position 15 in FIG. 6, the value of the replacement for the metacharacter is "12"; therefor the number of bits needed to represent this metacharacter value has to be changed. To accomplish this change from an "m" bit representation to an "n" bit representation the sequence $1_1 0_m n_4$ is inserted (where $n_4$ means the value "n" representation as in "4" bit binary number) into the bit stream. The sequence $1_1 0_m$ is a flag value indicating that the bit size of a metacharacter is the value that follows. The sequence "$n_4$" is the value that follows and indicates that metacharacters will now be represented using "n" bits. Continuing with the example in FIG. 6, to change the number of bits needed to represent metacharacters from 3 to 4 to cover the value "12" in buffer position 15, the flag sequence "1000" 33 is used to indicate that a change follows and the sequence "0100" 34 indicates that metacharacters will now be represented by four bits.

The result of the application of my compression method reduces the expression "abracadabraabracadabraabracadabra" which consists of 33 characters of 8 bits each for a total of 264 bits, to a compressed form requiring only 105 bits for a reduction of roughly 60%. Appendix 1 shows pseudocode for data compression in accordance with my inventive compression method, including the above described example.

An advantage of my invention is that only the needed records are expanded and not the database as a whole, and that the records can be expanded relatively quickly by the apparatus depicted in FIG. 2. Basically, expansion is accomplished by reversing the process. To begin, the compressed record is read into a buffer 113 with each character read directly into the buffer and each metacharacter is made negative and then read into the buffer. Characters can be identified because they are preceded by a flag bit set to 0 and metacharacters can be identified because they are preceded by a flag bit set to 1. Once all the data is in the buffer 113, it is expanded. Starting at the beginning of the buffer each data element is examined by circuit 114; when a character is found it is written directly by circuit 115 to a file 116 in memory; when a metacharacter is found, the value of the metacharacter is summed with its buffer position and then the resultant value is used to read the buffer 113. The data element pair at that position is examined. If a character is found it is written to the buffer. If a metacharacter is found then it is summed with its buffer position, and the character pair at the new buffer position indicated by the new index value is examined. This process is repeated until only characters are found, thus providing my inventive expansion method with its recursive characteristic.

Figure 7:
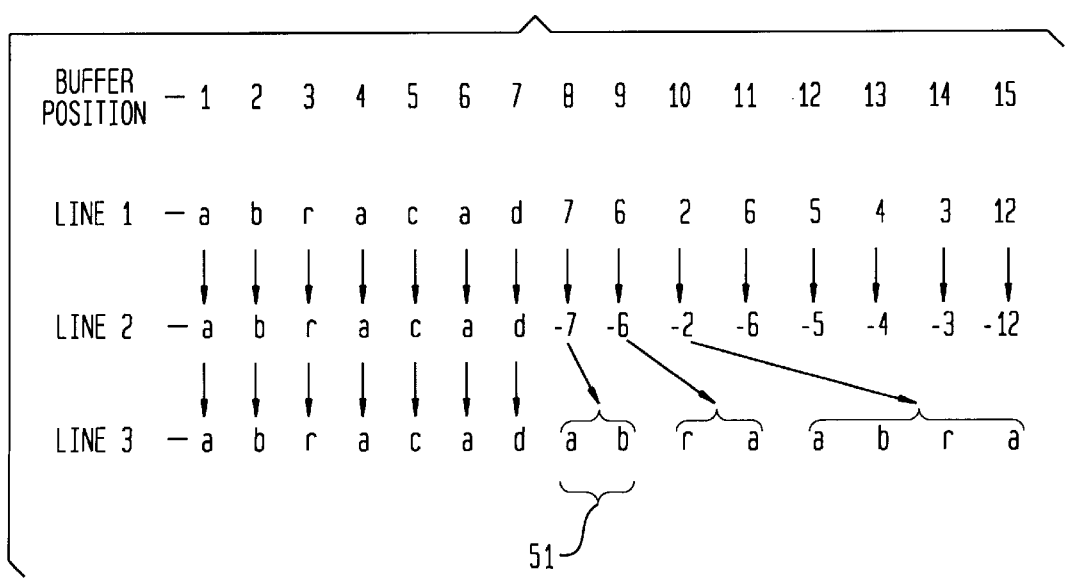
FIG. 7 depicts an example of expanding the data compressed in accordance with my invention.

FIG. 7 shows the application of my inventive recursive expansion method. Line 1 depicts the content of the compressive data record. Line 2 depicts the data record as read into a buffer in accordance with my invention method. Line 3 shows the expansion of selected elements of the buffer. Buffer positions 1 through 7 are characters and are directly written into the output file. At buffer position 8, the value −7 of the metacharacter is added to the value of the buffer position resulting in a value of 1. Therefore, the data element pair at buffer position 1 (a,b) is written into the output file shown as item 51. FIG. 7 also shows a recursive expansion. The value −2 in buffer position 10 is added to the value of the buffer position resulting in a value of 8. Looking at pair of data elements in buffer position 8, a pair metacharacters is found "−7,−6". Each of these metacharacters is then expanded as described above until the characters "a,b,r,a" are found at positions 1 through 4. Appendix 2 depicts pseudocode for data expansion in accordance with my invention.

Clearly, those skilled in the art recognize that the principles that define my inventive compression method and apparatus are not limited to the embodiments illustrated herein. As an example, in the embodiment described, the data elements are paired for comparison; those skilled in the art recognize that the grouping of data elements in sizes other than pairs but which still embodies the repetitive grouping, comparing, and replacing principles, is a compression method in accordance with my invention. Other embodiments may readily devised by those skilled in the art.

APPENDIX 1

```
procedure COMPRESS:
  repeat
    N = 2;
    read BYTE from input:
    store BYTE in BUFFER[1];
    store BYTE to MAX_VALUE;
    repeat
       read BYTE from input;
       store BYTE at BUFFER[N];
       if BYTE > MAX_VALUE then MAX_VALUE = BYTE;
       repeat
          check if (BUFFER[N−1], BUFFER[N]) is found in first N−2
          elements of BUFFER as (BUFFER[POSITION],BUFFER[POSITION+1]);
          if found then
             N = N−1;
             replace BUFFER[N] with (-POSITION);
          until not found;
          N = N+1;
    until BUFFER full or end of input file;
    MAX_SIZE = SIZE(MAX_VALUE);
    put MAX_SIZE as 4 bit data;
    FLAG_SIZE = 4;
    IX = 1;
    repeat
       if BUFFER[IX] > 0 then
             put 0 as 1 bit data;
             put BUFFER[IX] as MAX_SIZE bit data;
       else
             TEMP = IX + BUFFER[IX];
             TEMP_SIZE = SIZE[TEMP];
             if TEMP_SIZE=FLAG_SIZE then
                put 1 as 1 bit data;
                put 1 as FLAG_SIZE data:
                FLAG_SIZE = TEMP_SIZE;
                put FLAG_SIZE as 4 bit data;
             put 1 as 1 bit data;
             put TEMP as FLAG_SIZE bit data;
    until IX > N;
  until end of input file;
  put 1 as 1 bit data
  put 0 as 4 bit data; /"end of file"/
NOTE: The I/O functions are:
             read -reads one byte at a time from input file
             write -writes one byte at a time
             get -reads the number of bits specified as parameter
                   and pack their in an integer
             put -writes out only the last "N" bits of the data;
                   N is a parameter;
Other function:
             SIZE -computes the minimum number of bits required
                   for representing the data.
```

APPENDIX 2

```
procedure DECOMPRESS:
  repeat
    set MARK_SIZE to default(4);
    get 4 bits as DATA_SIZE;
    if DATA_SIZE = 0 then STOP;
    clear BUFFER;
    repeat
      get 1 bit as FLAG;
      if FLAG = 0
        then
          get DATA_SIZE bits as DATA;
          stack DATA in BUFFER;
        else
          get MARK_SIZE bits as MARK;
          if MARK > 1 then stack (-MARK) in BUFFER;
          if MARK = 1 then get 4 bits as MARK_SIZE;
      until MARK = 0;
      set INDEX = 0;
      repeat
        DATA = BUFFER[INDEX];
        if DATA > 0 then write DATA;
        else EXPAND(DATA + INDEX);
        INDEX = INDEX + 1;
      until INDEX > number of data in BUFFER;
  forever
procedure EXPAND of integer IX;
  if BUFFER[IX]>=0 then write BUFFER[IX]
  else EXPAND(BUFFER[IX]+IX);
  if BUFFER[IX+1]>=0 then write BUFFER[IX+1]
  else EXPAND (BUFFER [IX+1]+IX+1);
```

What is claimed is:

1. A method for operating a data processing computer to compact data records comprising the steps of:

reading data elements from said data records into a buffer;

grouping the last data elements entered in said buffer;

comparing said grouped data elements to all other equal size groupings of data elements in said buffer;

replacing said grouped data elements with a single new metacharacter data element representing an index value that indicates a location in said buffer preceding said grouping of last data elements where an identical grouping is found;

regrouping said metacharacter data element with its preceding data element or metacharacter data element;

repeating said comparing, replacing, and regrouping steps until no new matches are found; and storing as a compressed data record said data elements and said metacharacter data elements stored in said buffer.

2. The method according to claim 1 further including the steps of:

reading a new data element from said data records into said buffer after said repeating step;

grouping said new data element with the data element or metacharacter data element which precedes the new data element in the buffer; and repeating said comparing, replacing, regrouping, and repeating steps.

3. The method of claim 2 wherein said grouping said new data element step further comprises storing said metacharacter data element as a negative number.

4. The method according to claim 3 wherein said method includes the step of building an output file comprising the steps of:

storing said data elements using only the smallest number of bits necessary to completely represent the data elements and preceding said data elements with a flag bit; and summing the value of said metacharacter data element with the value of its current position in the buffer and then storing said sum using three bits preceded by a flag bit.

5. The method according to claim 4 wherein said building an output file step includes the step of increasing the bits used to represent a metacharacter data element when three bits isn't enough, said increasing step includes inserting a flag sequence in the output file indicating that the number of bits used to represent a metacharacter data element is changing, with said flag sequence followed by a binary representation of the new number of bits used to represent said metacharacter data elements.

6. A method for operating data processing equipment to compress a database having a plurality of individual records where each of said records is compressed individually and decompress said records, comprising the steps of:

reading data elements from said record into a buffer;

comparing the last two data elements in the buffer to other data element pairs stored in the buffer in the order in which the data elements where stored in the buffer and if a match is found, replacing the last two data elements with one data element with a value that reflects a negative value of the location in the buffer where the match is found;

repeating said comparing step using the replacement data element grouped with its preceding data element until no new matches are found;

reading the next data element from the data record into the buffer and then repeating said comparing and repeating steps until a complete record is compressed; and storing in memory said complete compressed record.

7. The method as recited in claim 6 wherein said method includes the step of creating an output file comprising the steps of:

storing in said output file each positive data element using only the minimum number of bits necessary to represent said data element all preceded by a one bit flag set to 0;

summing the value of each negative data element with its position in the buffer and replacing the negative data element value with said sum; and storing in said output file said sum using three bits preceded by a one bit flag set to 1.

8. The method according to claim 7 wherein said creating an output file step further includes the step of increasing from three the number of bits used to represent said sums by inserting in the sequence of data elements a flag sequence followed by a binary representation of the value for said increased number of bits used to represent said sums.

9. A method for operating data processing equipment to compress a database having a plurality of individual records where each of said records is compressed individually and for expanding said compressed database record, comprising the steps of:

reading data elements from said record into a buffer;

comparing the last two data elements in the buffer to other data element pairs stored in the buffer in the order in which the data elements where stored in the buffer and if a match is found, replacing the last two data elements with one data element with a value that reflects a negative value of the location in the buffer where the match is found;

repeating said comparing step using the replacement data element grouped with its preceding data element until no new matches are found;

reading the next data element from the data record into the buffer and then repeating said comparing and repeating steps until a complete record is compressed;

storing in memory said complete compressed record;

reading said compressed database record into a buffer;

examining said record identifying data elements and index values indicating positions in said compressed database record;

identifying data elements at the positions within said compressed data record indicated by said index values and if another index value is found at the position indicated by said index value repeating this identifying step; and creating a file of an expanded data record by directly writing to said file said data elements identified in said examining step and said data elements identified in said identifying step.

* * * * *